(12) United States Patent
Aleksov et al.

(10) Patent No.: US 11,462,480 B2
(45) Date of Patent: Oct. 4, 2022

(54) MICROELECTRONIC ASSEMBLIES HAVING INTERPOSERS

(71) Applicant: Intel Corporation, Santa Clara, CA (US)

(72) Inventors: Aleksandar Aleksov, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 953 days.

(21) Appl. No.: 16/020,295

(22) Filed: Jun. 27, 2018

(65) Prior Publication Data
US 2020/0006235 A1    Jan. 2, 2020

(51) Int. Cl.
*H01L 23/538* (2006.01)
*H01L 25/18* (2006.01)
(Continued)

(52) U.S. Cl.
CPC ...... *H01L 23/5386* (2013.01); *H01L 21/4853* (2013.01); *H01L 23/13* (2013.01);
(Continued)

(58) Field of Classification Search
CPC . H01L 23/5386; H01L 23/5385; H01L 25/18; H01L 23/13; H01L 25/50; H01L 23/5389; H01L 23/66; H01L 23/5381; H01L 21/4853; H01L 2223/6616; H01L 2223/6627; H01L 2224/73253; H01L 2224/32145; H01L 2224/32225; H01L 2224/2929; H01L 2224/293; H01L 24/17; H01L 24/16; H01L 24/32; H01L 24/73; H01L 24/97; H01L 24/81; H01L 2224/97; H01L 2224/92242; H01L 2224/81192; H01L 2224/17104; H01L 2224/171; H01L 23/5383; H01L 23/5384; H01L 2224/16227; H01L 2924/15192;
(Continued)

(56) References Cited

U.S. PATENT DOCUMENTS 7,800,459 B2    9/2010    Hall et al.
2014/0035093 A1    2/2014    Pincu et al.
(Continued)

FOREIGN PATENT DOCUMENTS

JP    2006259682    *    9/2006
KR    1020170079544 A    7/2017

*Primary Examiner* — Ahmed N Sefer
(74) *Attorney, Agent, or Firm* — Akona IP

(57) ABSTRACT

Microelectronic assemblies, and related devices and methods, are disclosed herein. For example, in some embodiments, a microelectronic assembly may include a package substrate having a high bandwidth interconnect, a first interposer having high bandwidth circuitry coupled to the package substrate, wherein the high bandwidth circuitry of the first interposer is electrically coupled to the high bandwidth interconnect, and a second interposer having high bandwidth circuitry coupled to the package substrate, wherein the high bandwidth circuitry of the second interposer is electrically coupled to the high bandwidth interconnect, and wherein the first interposer is electrically coupled to the second interposer via the high bandwidth interconnect.

25 Claims, 12 Drawing Sheets

(51) Int. Cl.
*H01L 23/13* (2006.01)
*H01L 25/00* (2006.01)
*H01L 23/66* (2006.01)
*H01L 21/48* (2006.01)
*H01L 23/00* (2006.01)

(52) U.S. Cl.
CPC ...... *H01L 23/5381* (2013.01); *H01L 23/5385* (2013.01); *H01L 23/5389* (2013.01); *H01L 23/66* (2013.01); *H01L 24/17* (2013.01); *H01L 25/18* (2013.01); *H01L 25/50* (2013.01); *H01L 23/5383* (2013.01); *H01L 24/16* (2013.01); *H01L 24/32* (2013.01); *H01L 24/73* (2013.01); *H01L 24/81* (2013.01); *H01L 2223/6616* (2013.01); *H01L 2223/6627* (2013.01)

(58) Field of Classification Search
CPC . H01L 2225/06513; H01L 2224/16146; H01L 2224/17181; H01L 2924/15153; H01L 2924/15311; H01L 25/0655; H01L 25/0652; H01L 2225/06517; H01L 2225/06548; H01L 2225/06572; H01L 2224/16235
See application file for complete search history.

(56) References Cited

U.S. PATENT DOCUMENTS

| | | | |
|---|---|---|---|
| 2014/0042463 A1* | 2/2014 | Uemura | H01L 31/12 257/80 |
| 2014/0151892 A1 | 6/2014 | Kang et al. | |
| 2014/0285277 A1* | 9/2014 | Herbsommer | H01P 5/107 333/1 |
| 2015/0115405 A1 | 4/2015 | Wu et al. | |
| 2015/0287672 A1 | 10/2015 | Yazdani | |
| 2016/0276727 A1 | 9/2016 | Dang et al. | |
| 2016/0276729 A1* | 9/2016 | Dang | H01L 23/5384 |
| 2018/0047663 A1 | 2/2018 | Camarota | |
| 2018/0076171 A1 | 3/2018 | Singh et al. | |
| 2018/0145051 A1 | 5/2018 | Loo et al. | |
| 2018/0191047 A1* | 7/2018 | Huang | H01P 1/2002 |

* cited by examiner

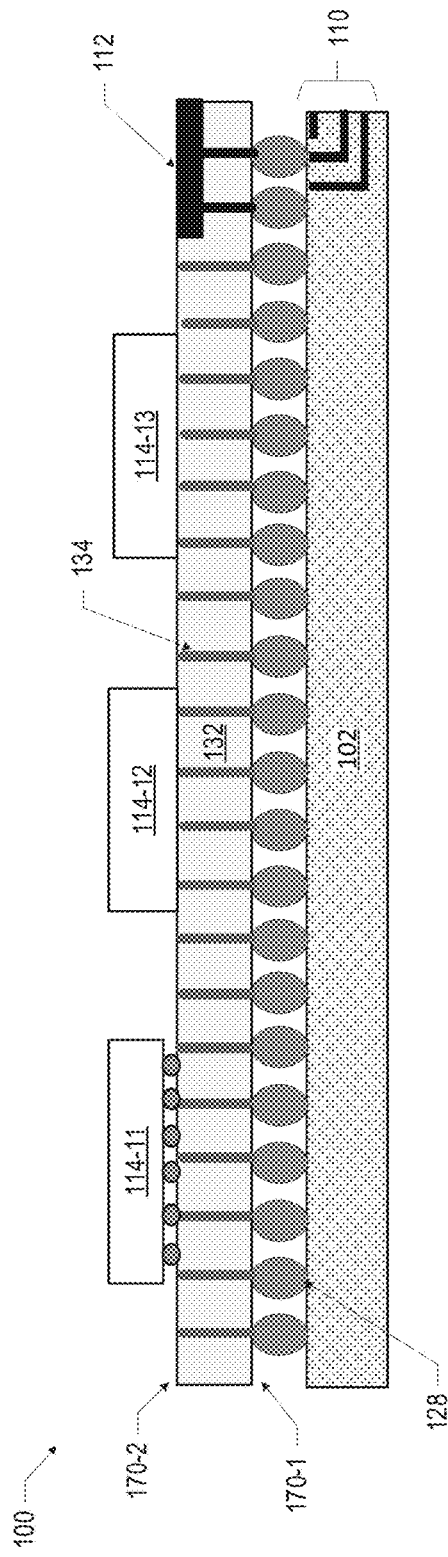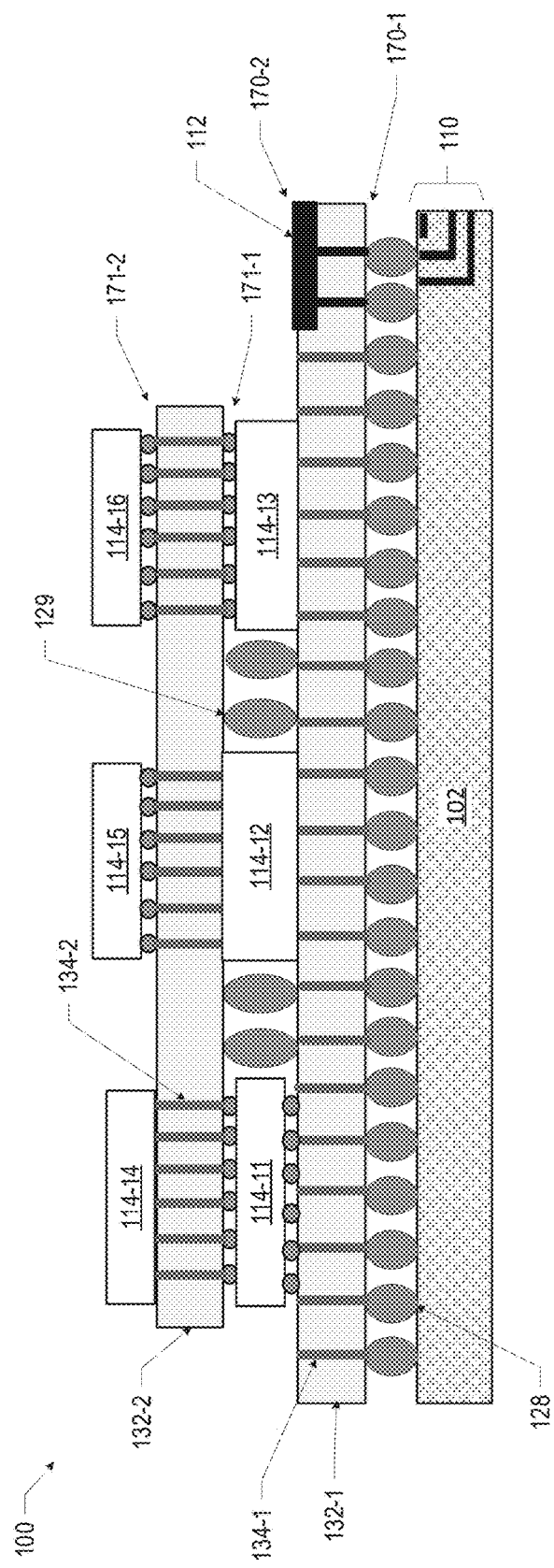

MICROELECTRONIC ASSEMBLIES HAVING INTERPOSERS

BACKGROUND

Integrated circuit (IC) dies are conventionally coupled to a package substrate for mechanical stability and to facilitate connection to other components, such as circuit boards. The interconnectivity achievable by conventional substrates is constrained by manufacturing, materials, and thermal considerations, among others.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2-7 are side, cross-sectional views of example microelectronic assemblies, in accordance with various embodiments.

DETAILED DESCRIPTION

Figure 1:
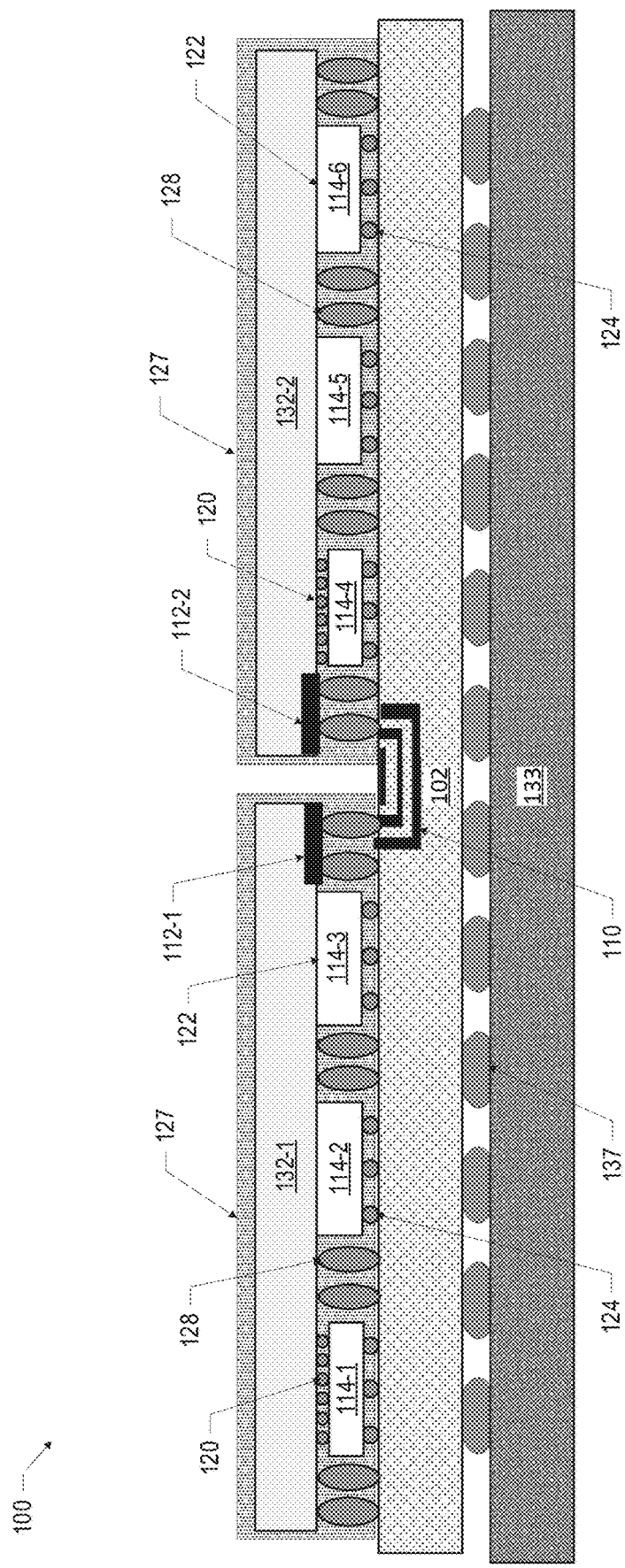
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a package substrate having a high bandwidth (HBW) interconnect, a first interposer having high bandwidth circuitry coupled to the package substrate, wherein the high bandwidth circuitry of the first interposer is electrically coupled to the high bandwidth interconnect; and a second interposer having high bandwidth circuitry coupled to the package substrate, wherein the high bandwidth circuitry of the second interposer is electrically coupled to the high bandwidth interconnect, and wherein the first interposer is electrically coupled to the second interposer via the high bandwidth interconnect.

Communicating large numbers of signals between two or more dies in a multi-die IC package is challenging due to the increasingly small size of such dies, thermal constraints, and power delivery constraints, among others. Various ones of the embodiments disclosed herein may help achieve HBW interconnectivity of multiple IC dies, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications as well as complex computational applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

Various aspects of the illustrative implementations may be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified.

When used to describe a range of dimensions, the phrase "between X and V" represents a range that includes X and Y. For convenience, the phrase "FIG. 8" may be used to refer to the collection of drawings of FIGS. 8A-8B, the phrase "FIG. 9" may be used to refer to the collection of drawings of FIGS. 9A-9D, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the mold material 127, the second-level interconnects 137, and/or the circuit board 133 may not be included. Further, FIG. 1 illustrates a number of elements that are omitted from subsequent drawings for ease of illustration, but may be included in any of the microelectronic assemblies 100 disclosed herein. Examples of such elements include the second interposer 132-2, the mold material 127, the second-level interconnects 137, and/or the circuit board 133. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

The microelectronic assembly 100 may include multiple interposers 132 having HBW interconnect circuitry 112 coupled to a package substrate 102 having an HBW interconnect 110. In particular, a first interposer 132-1 may be electrically coupled to a second interposer 132-2 via the HBW interconnect 110 in the package substrate 102. As illustrated in FIG. 1, the HBW circuitry 112-1 of the first interposer 132-1 may be coupled to the HBW interconnect 110 in the package substrate 102 and the HBW circuitry 112-2 of the second interposer 132-2 may be coupled to the HBW interconnect 110 in the package substrate 102 such that the first interposer 132-1 may be electrically coupled to the second interposer 132-2 via the HBW interconnect 110.

The HBW interconnect 110 may include a waveguide. A waveguide may refer to any linear structure that conveys electromagnetic waves between its endpoints. For example, a waveguide may refer to a rectangular metal tube inside which an electromagnetic wave may be transmitted. A waveguide may include a waveguide filter. A waveguide filter is an electronic filter that is constructed with waveguide technology to form resonator cavities within a waveguide, which allow signals at some frequencies to pass (the passband) and signals at other frequencies to be rejected (the stopband). For example, a waveguide filter may filter signal at high frequencies (e.g., equal to or greater than about 100 GHz), such as radio frequency (RF) and Millimeter Wave/Terahertz (mmWave/THz), such that a waveguide filter may operate at RF/mmWave frequencies (e.g., an RF waveguide). A waveguide typically has a rectangular block, or cuboidal, shape with two substantially parallel horizontal sides extending in the x-y directions and two substantially parallel vertical walls extending in the x-z directions. The waveguide may be filled with a dielectric material or may be filled with air. Examples of different types of waveguide-based components include power combiners, power dividers, waveguide filters, directional couplers, diplexers, and multiplexers, among others. Waveguides may be integrated into substrates of electronic devices using lithographic processes, such that the vertical walls of the structure are continuous and/or substantially planar. The waveguide in the package substrate 102 may be connected to the interposers 132-1, 132-2 via interconnects 128 and may provide HBW interconnectivity between the interposers 132-1, 132-2.

Figure 5:
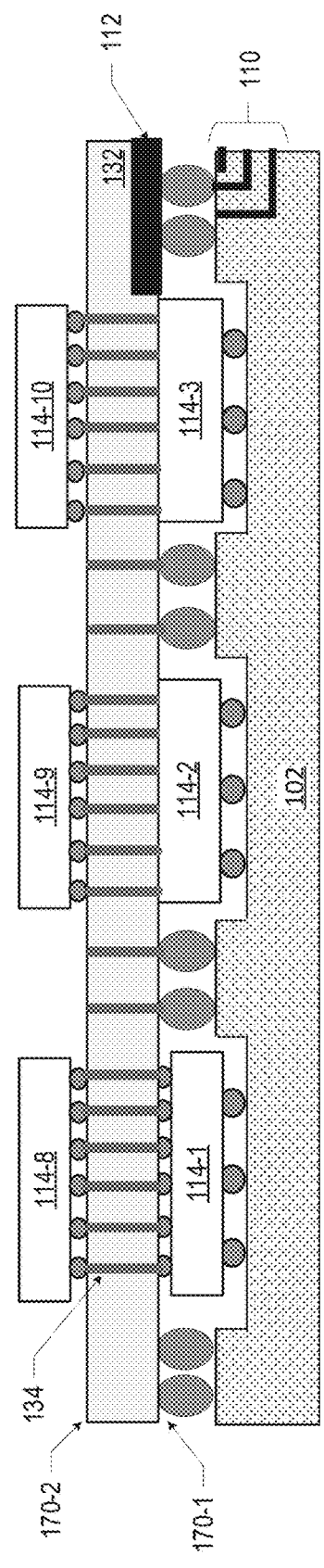

The interposer 132 may include HBW circuitry 112. The HBW circuitry may include circuitry to generate HBW, high frequency signals to enable HBW data transmission rates between interposers. The HBW circuitry 112 may include RF circuitry for transmitting and receiving signals at RF frequencies. In some embodiments, the HBW circuitry 112 may include circuitry for transmitting signals at mmWave frequencies. The interposer 132 may be an active interposer, having conductive pathways and/or interconnection traces (not shown) for electrically coupling the dies 114 to each other via the interposer 132. In some embodiments, the interposer 132 may have an active surface and an opposing non-active surface or silicon surface. When the interposer 132 is an active interposer, the dies 114 may be coupled to the active surface of the interposer 132 on a first surface (e.g., where the active surface of the interposer 132 is facing towards the package substrate 102 and the silicon surface of the interposer 132 is facing away from the package substrate, as shown in FIG. 1), and the dies 114 may be coupled to the package substrate on an opposing second surface. In some embodiments, the interposer 132 may include conductive pathways to route power, ground, and/or signals to/from the package substrate 102 to the dies 114. In some embodiments, the interposer 132 may provide HBW interconnectivity and some power delivery to the dies 114 and the package substrate may provide some auxiliary I/O and some power delivery. In some embodiments, the interposer 132 may include through-silicon vias (TSVs) for electrically coupling dies 114 on opposing surfaces of the interposer 132 (e.g., as shown in FIG. 5), or for electrically coupling dies 114 to the package substrate 102 via the TSVs in the interposer (e.g., as shown in FIG. 6). The TSVs may extend from a first surface of the interposer to a second surface of the interposer. In some embodiments, the interposer 132 may be a passive interposer having TSVs for electrically coupling dies on opposing surfaces (e.g., the interposer 132-2 as shown in FIG. 7).

The interposer 132 may include contact pads or other conductive features on a surface to make connections to the dies 114 and/or the package substrate 102. The dies 114 may be coupled to the interposer 132 via die-to-interposer (DTI) interconnects 120, 122. The DTI interconnects 120, 122 may include solder bumps or balls, wirebonds, a metal-to-metal interconnect, conductive adhesive, such as an anisotropic conductive film, or any other suitable interconnect. The interposer 132 may be coupled to the package substrate 102 via interposer-to-package-substrate (ITPS) interconnects 128. The ITPS interconnects 128 may include solder bumps or balls, wirebonds, a metal-to-metal interconnect, conductive adhesive, such as an anisotropic conductive film, or any other suitable interconnect. In some embodiments, the package substrate 102 may be a lower density medium and the dies 114 may be a higher density medium. In some embodiments, the DTI interconnects may have a higher density (e.g., finer pitch) and the ITPS interconnects may have a lower density (e.g., coarser pitch). As used herein, the term "lower density" and "higher density" are relative terms indicating that the conductive pathways (e.g., including conductive lines and conductive vias) in a lower density medium are larger and/or have a greater pitch (e.g., at least about 5% greater, at least about 15%, or at least 25% greater) than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a printed circuit board (PCB), manufactured using a standard PCB process (e.g., a standard subtractive process using etch chemistry to remove areas of unwanted copper, and with coarse vertical interconnect features formed by a standard laser process). In some embodiments, the interposer may include other components, such as passive devices (e.g., resistors, capacitors, and/or inductors), or other computing components or circuitry.

The interposer 132 may be formed from any suitable material, such as silicon. The interposer 132 may have any suitable dimensions. In some embodiments, the interposer may have an x-y dimension of between about 10 square millimeters (mm$^2$) and 1000 mm$^2$ (e.g., between 10 mm$^2$ and 100 mm$^2$, or between 50 mm$^2$ and 500 mm$^2$), where the x-y dimension is defined by length times width (e.g., area). In some embodiments, the interposer 132 may have a z-height between about 10 microns/micrometers (um) and 500 um (e.g., between 10 um and 250 um, or between 200 um and 400 um), where the z-height is defined by the thickness. In some embodiments, the interposer 132 may have a z-height between about 50 um and 300 um (e.g., between 50 um and 200 um, or between 150 um and 300 um). In some embodiments, the interposer 132 may function as a heat spreader to move heat away from the dies 114.

The microelectronic assembly 100 may include a plurality of dies 114. The plurality of dies 114 may have a first surface and an opposing second surface, where the first surface of the die 114 may be coupled to the package substrate 102 and the second surface of the die 114 may be coupled to one of the interposers 132. As shown in FIG. 1, the first surface of dies 114-1, 114-2, 114-3, 114-4, 114-5, 114-6 may be coupled to the package substrate 102 via first level interconnects 124, the second surface of the dies 114-1, 114-2, 114-3 may be coupled to the first interposer 132-1 via DTI interconnects 120, 122, and the second surface of the dies 114-4, 114-5, 114-6 may be coupled to the second interposer 132-2 via DTI interconnects. The first level interconnects 124 may include solder bumps or balls, wirebonds, a metal-to-metal interconnect, conductive adhesive, such as an anisotropic conductive film, or any other suitable interconnect. In some embodiments, the die 114, the package substrate 102, and/or the interposer 132 may include bond pads or other conductive contacts on one or more surfaces to couple to the interconnects 120, 122, 124.

The dies 114 may perform any suitable functionality, and may include processing devices, memory, communications devices, sensors, or any other computing components or circuitry. For example, the dies may include a central processing unit (CPU), a platform controller hub (PCH), a memory die (e.g., dynamic random access memory (DRAM)), a graphic processing unit (GPU), and a field programmable gate array (FPGA). In some embodiments, dies 114 having the same or similar functionality may be disposed on a single interposer. In some embodiments, dies 114 having the same or similar functionality may be disposed on two or more interposers. In some embodiments, dies 114 having different functionalities may be disposed on a single interposer. The die 114 may be a single-sided die (in the sense that the die 114 only has conductive contacts on a single surface) or may be a double-sided die (in the sense that the die 114 has conductive contacts on a both surfaces). The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 14. The conductive pathways in the dies 114 may be bordered by liner materials, such as adhesion liners and/or barrier liners, as suitable.

In some embodiments, the die 114 may only include conductive pathways, and may not contain active or passive circuitry. In other embodiments, the die 114 may include active or passive circuitry (e.g., transistors, diodes, resistors, inductors, and capacitors, among others). In some embodiments, the die 114 may include one or more device layers including transistors (e.g., as discussed below with reference to FIG. 14). When the die 114 includes active circuitry, in some embodiments, power and/or ground signals may be routed through the package substrate 102 to the die 114 through the first level interconnects 124. In some embodiments, power and/or ground signals may be routed through the package substrate 102 to the interposer 132 through the ITPS interconnects 128 and to the dies 114 via the conductive pathways in the interposer 132.

Although FIG. 1 illustrates a specific number and arrangement of interposers 132 and dies 114 on the package substrate 102, these are simply illustrative, and any suitable number and arrangement may be used.

The package substrate 102 may include an insulating material (e.g., a dielectric material formed in multiple layers, as known in the art) and one or more conductive pathways through the dielectric material (e.g., including conductive traces and/or conductive vias, not shown). In some embodiments, the insulating material of the package substrate 102 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 102 is formed using standard PCB processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

The microelectronic assembly 100 of FIG. 1 may also include a mold material 127. The mold material 127 may extend around one or more of the interposers 132 and dies 114 on the package substrate 102. In some embodiments, the mold material 127 may be disposed on the interposer 132 and dies 114 prior to attachment to the package substrate 102. In some embodiments, the mold material 127 may be disposed on the interposer 132 and dies 114 after attachment to the package substrate 102. In some embodiments, the mold material 127 before above one or more of the interposers 132 on the package substrate 102. In some embodiments, the mold material 127 may extend between one or more of the interposers 132 and the package substrate 102 around the associated dies 114 and interconnects 120, 122, 124; in such embodiments, the mold material 127 may serve as an underfill material. The mold material 127 may include multiple different mold materials (e.g., an underfill material, and a different overmold material). The mold material 127 may be an insulating material, such as an appropriate epoxy material. In some embodiments, the mold material 127 may include an underfill material that is an epoxy flux that assists with soldering the dies 114 to the package substrate 102 when forming the first level interconnects 124, and then polymerizes and encapsulates the first level interconnects 124. The mold material 127 may be selected to have a coefficient of thermal expansion (CTE) that may mitigate or minimize the stress between the dies 114, the interposer 132, and the package substrate 102 arising from uneven thermal expansion in the microelectronic assembly 100.

The microelectronic assembly 100 of FIG. 1 may also include a circuit board 133. The package substrate 102 may be coupled to the circuit board 133 by second-level interconnects 137 at the bottom surface of the package substrate 102. The second-level interconnects 137 illustrated in FIG. 1 are solder balls (e.g., for a ball grid array arrangement), but any suitable second-level interconnects 137 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 137 may not couple the package substrate 102 to a circuit board 133, but may instead couple the package substrate 102 to another IC package, an interposer, or any other suitable component.

Figure 2:
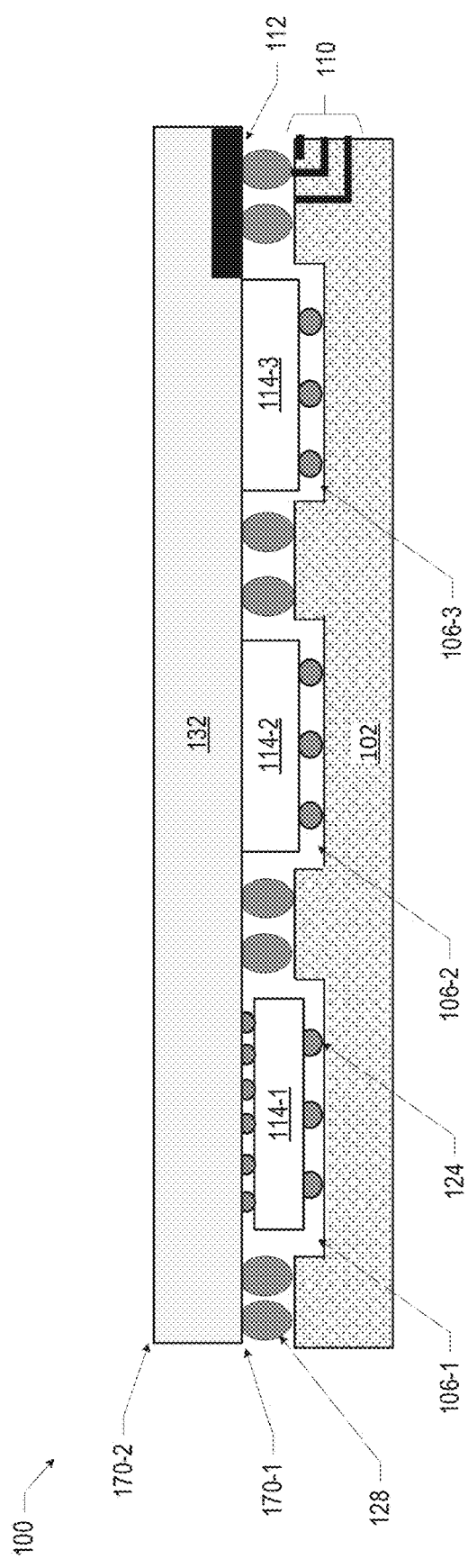

FIG. 2 is a side, cross-sectional view of an example microelectronic assembly, in accordance with various embodiments. As shown in FIG. 2, the microelectronic assembly 100 may include an interposer 132 having HBW interconnect circuitry 112 coupled to a package substrate 102 having an HBW interconnect 110. The interposer 132 may include an active surface 170-1 and a silicon surface 170-2. The interposer 132 may be electrically coupled to one or more other interposers 132 (not shown) via the HBW interconnect 110 in the package substrate 102. The microelectronic assembly 100 may include multiple dies 114-1, 114-2, 114-3 coupled to the package substrate 102 on a first surface and coupled to the active surface 170-1 of the interposer 132 on a second surface, such that the dies 114 may be accessed electrically from both the first and the second surfaces. The package substrate may include one or more cavities 106-1, 106-2, 106-3 for housing the dies 114-1, 114-2, 114-3, respectively. The cavities 106 may have any suitable dimensions for housing the dies 114. For example, the dies 114-1, 114-2, 114-3 may have different thicknesses and the cavities 106-1, 106-2, 106-3 may be designed to have different depths, such that the second surface of the dies 114 are planar.

Figure 3:
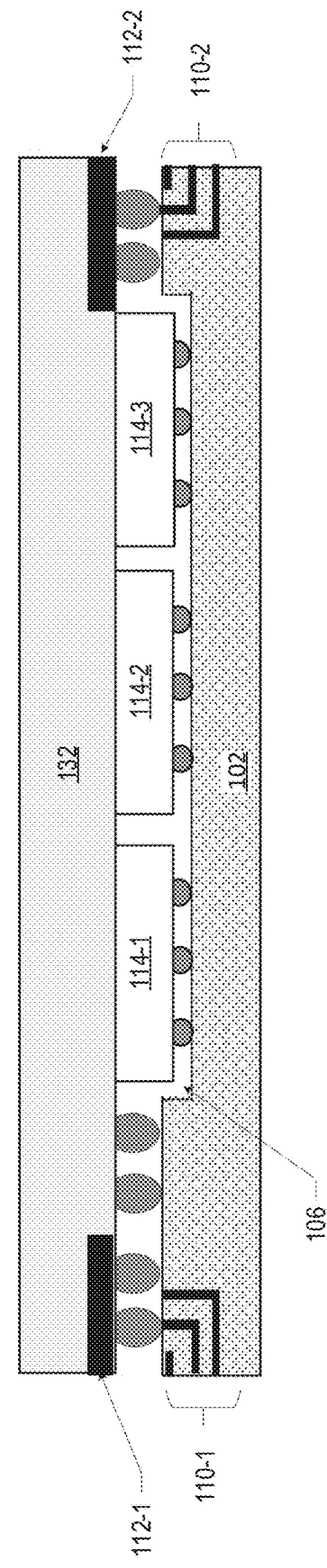

FIG. 3 is a side, cross-sectional view of an example microelectronic assembly, in accordance with various embodiments. As shown in FIG. 3, the microelectronic assembly 100 may include an interposer 132 having multiple HBW interconnect circuitries 112-1, 112-2 coupled to a package substrate 102 having multiple HBW interconnects 110-1, 110-2, such that the interposer 132 may be coupled to multiple other interposers (not shown) via the HBW interconnects 110-1, 110-2 in the package substrate 102. The microelectronic assembly 100 may include multiple dies 114-1, 114-2, 114-3 coupled to the package substrate 102 on a first surface and coupled to the interposer 132 on a second surface, such that the dies 114 may be accessed electrically from both the first and the second surfaces. The package substrate may include a single cavity 106 for housing the dies 114-1, 114-2, 114-3. The cavity 106 may have any suitable dimensions for housing the dies 114 and the dies 114 may be spaced closely together. Although FIG. 3 shows the cavity 106 housing three dies 114, a cavity 106 may house any number of dies.

Figure 4:
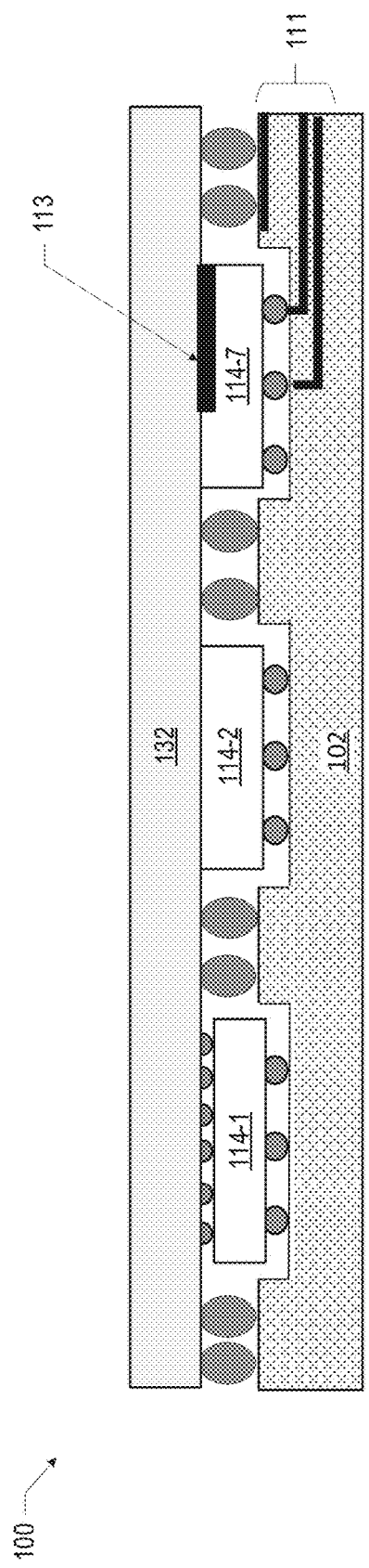

FIG. 4 is a side, cross-sectional view of an example microelectronic assembly, in accordance with various embodiments. As shown in FIG. 4, the microelectronic assembly 100 may include an interposer 132 having a die 114-7 electrically coupled to an HBW interconnect 111 in the package substrate 102. The die 114-7 may include HBW circuitry 113 such that the interposer 132 may be electrically coupled to one or more other interposers 132 (not shown) via the HBW circuitry 113 in the die 114-7 and the HBW interconnect 111 in the package substrate 102. In some embodiments, the die 114-7 may include an RF die having RF circuitry.

FIG. 5 is a side, cross-sectional view of an example microelectronic assembly, in accordance with various embodiments. As shown in FIG. 5, the microelectronic assembly 100 may include an interposer 132 having a plurality of dies 114-1, 114-2, 114-3 disposed on a first surface 170-1, and a plurality of dies 114-8, 114-9, 114-10 disposed on a second surface 170-2. The dies 114-1, 114-2, 114-3 on the first surface 170-1 may be electrically coupled to the dies 114-8, 114-9, 114-10 on the second surface 170-2 by TSVs 134. In some embodiments, the interposer 132 may be a passive interposer. In some embodiments, the interposer 132 may be an active interposer. For example, the interposer 132 may be an active interposer having the first surface 170-1 as the active surface. The interposer 132 may include HBW circuitry 112 to connect the HBW interconnect 110 in the package substrate 102.

FIG. 6 is a side, cross-sectional view of an example microelectronic assembly, in accordance with various embodiments. As shown in FIG. 6, the microelectronic assembly 100 may include an interposer 132 having a plurality of TSVs 134 and multiple dies 114-11, 114-12, 114-13 disposed on a second surface 170-2. The interposer 132 may be coupled to the package substrate 102 by ITPS interconnects 128. In some embodiments, the interposer 132 may be a passive interposer. In some embodiments, the interposer 132 may be an active interposer. For example, the interposer 132 may be an active interposer having the second surface 170-2 as the active surface. The interposer 132 may include HBW circuitry 112 to connect the HBW interconnect 110 in the package substrate 102.

FIG. 7 is a side, cross-sectional view of an example microelectronic assembly, in accordance with various embodiments. As shown in FIG. 7, the microelectronic assembly 100 may include stacked interposers 132-1, 132-2. In particular, the microelectronic assembly 100 may include a first interposer 132-1 having a plurality of TSVs 134-1 and multiple dies 114-11, 114-12, 114-13 coupled to the second surface 170-2 of the first interposer 132-1. The first surface 170-1 of the first interposer 132-1 may be coupled to the package substrate 102 by ITPS interconnects 128. The microelectronic assembly 100 may further include a second interposer 132-2 having a plurality of TSVs 134-2, the dies 114-11, 114-12, 114-13 disposed on a first surface 171-1, and the dies 114-14, 114-15, 114-16 disposed on a second surface 171-2. The dies 114-11, 114-12, 114-13 on the first surface 171-1 of the second interposer 132-2 may be electrically coupled to the dies 114-14, 114-15, 114-16 on the second surface 171-2 of the second interposer 132-2 by TSVs 134-2. The first surface 171-1 of the second interposer 132-2 may be coupled to the second surface 170-2 of the first interposer 132-1 by interconnects 129. In some embodiments, the interposer 132 may be a passive interposer. In some embodiments, the interposer 132 may be an active interposer. For example, the first interposer 132-1 may be an active interposer having the second surface 170-2 as the active surface. The first interposer 132-1 may include HBW circuitry 112 to connect the HBW interconnect 110 in the package substrate 102.

Figure 8A:
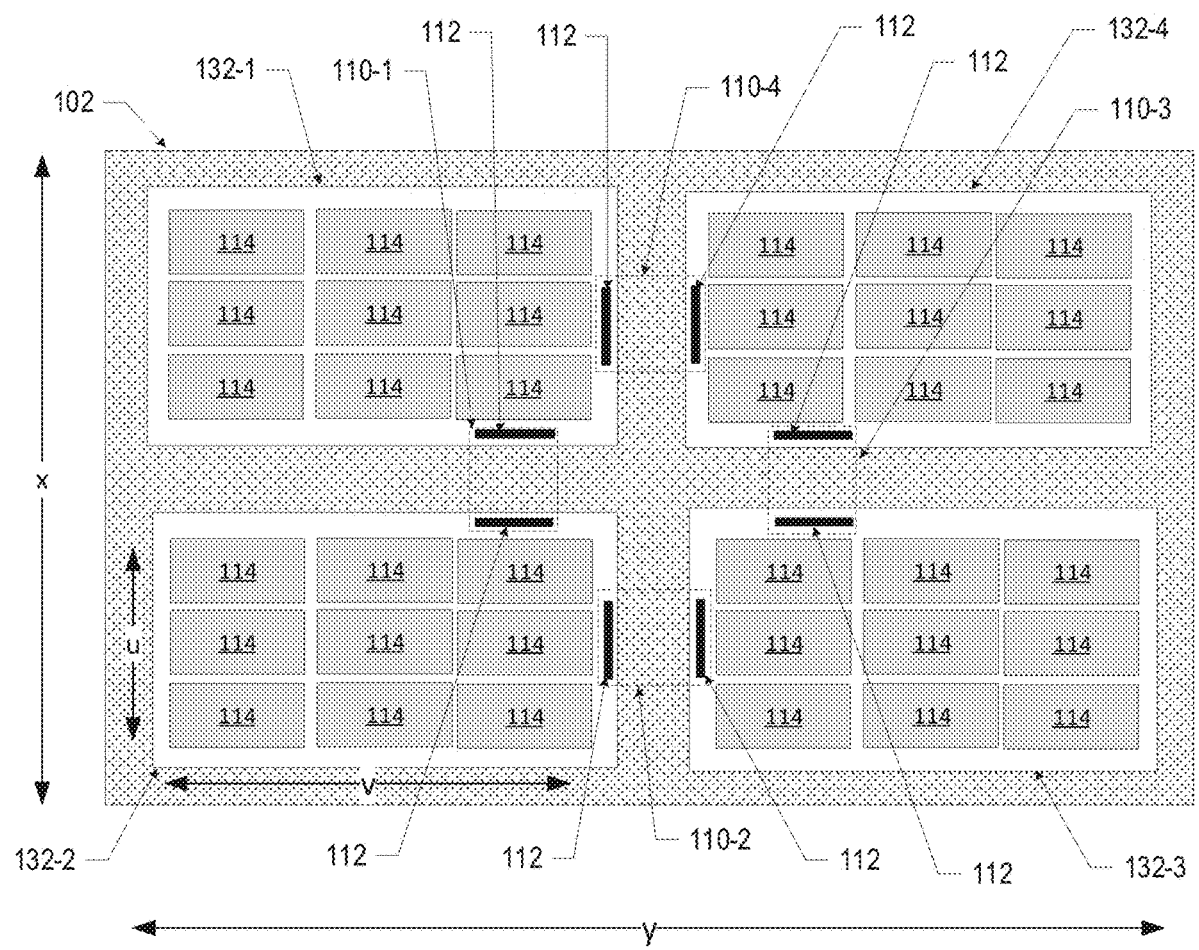
FIG. 8A is a top view of an example arrangement of multiple interposers in a microelectronic assembly, in accordance with various embodiments.

FIG. 8A is a top view of an example arrangement of multiple interposers in a microelectronic assembly, in accordance with various embodiments. As shown in FIG. 8A, a package substrate 102 may include four interposers 132 having HBW circuitry 112. The package substrate 102 may include HBW interconnects 110 for forming interposer-to-interposer connections. For example, HBW interconnect 110-1, HBW circuitry 112 of interposer 132-1, and HBW circuitry 112 of interposer 132-2 may form an HBW connection between interposer 132-1 and interposer 132-2; HBW interconnect 110-2 and HBW circuitry 112 of interposers 132-2 and 132-3, respectively, may form an HBW connection between interposer 132-2 and interposer 132-3; HBW interconnect 110-3 and HBW circuitry 112 fn interposers 132-3 and 132-4, respectively, may form an HBW connection between interposer 132-3 and interposer 132-4; and HBW interconnect 110-4 and HBW circuitry 112 of interposers 132-4 and 132-1, respectively, may form an HBW connection between interposer 132-4 and interposer 132-1. As shown in FIG. 8A, an individual interposer 132 may include a plurality of dies 114 disposed thereon. An individual interposer 132 may include any suitable number of dies 114 and the dies 114 may have any suitable arrangement. The dies 114 of an individual interposer 132 may be coupled via conductive pathways (not shown) in the interposer 132. The computational power of the microelectronic assembly 100 may be defined by the number of interposers (x*y) times the number of dies on each interposer (u*v). For example, the computational power of the microelectronic assembly in FIG. 8A is 36 (i.e., (2*2)*(3*3)). The HBW interconnectivity of interposers may provide a microelectronic assembly and/or system with complex computational solutions to coordinate operational resources across multiple interposers and multiple dies, and/or to apply core-hopping algorithms across multiple interposers to distribute the thermal load from one interposer to many interposers. The computational power of a microelectronic assembly may be reduced when an interposer includes a die having dedicate HBW circuitry as described above with reference to FIG. 4, as this die may be omitted from the computational calculations.

Figure 8B:
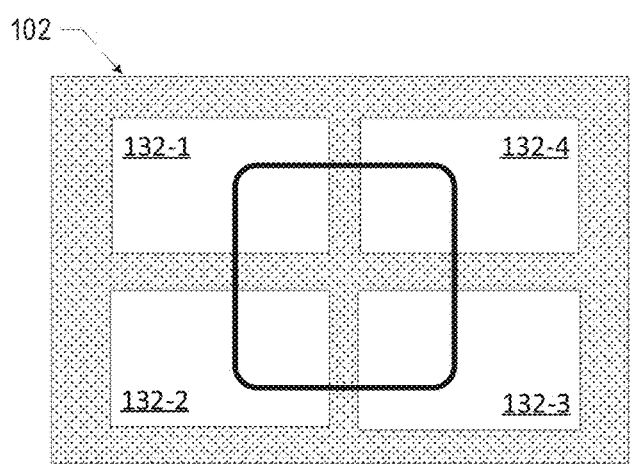
FIG. 8B is a schematic illustration of connectivity of the microelectronic assembly of FIG. 8A, in accordance with various embodiments.

FIG. 8B is a schematic illustration of connectivity of the microelectronic assembly of FIG. 8A, in accordance with various embodiments. FIG. 8B illustrates the HBW connectivity between each of the adjacent interposers via the HBW interconnects. For example, interposer 132-1 has a direct HBW connection to interposer 132-2 and interposer 132-4, and indirect HBW connection to interposer 132-3 via the HBW interconnect with interposer 132-2 or interposer 132-4.

Figure 9A:
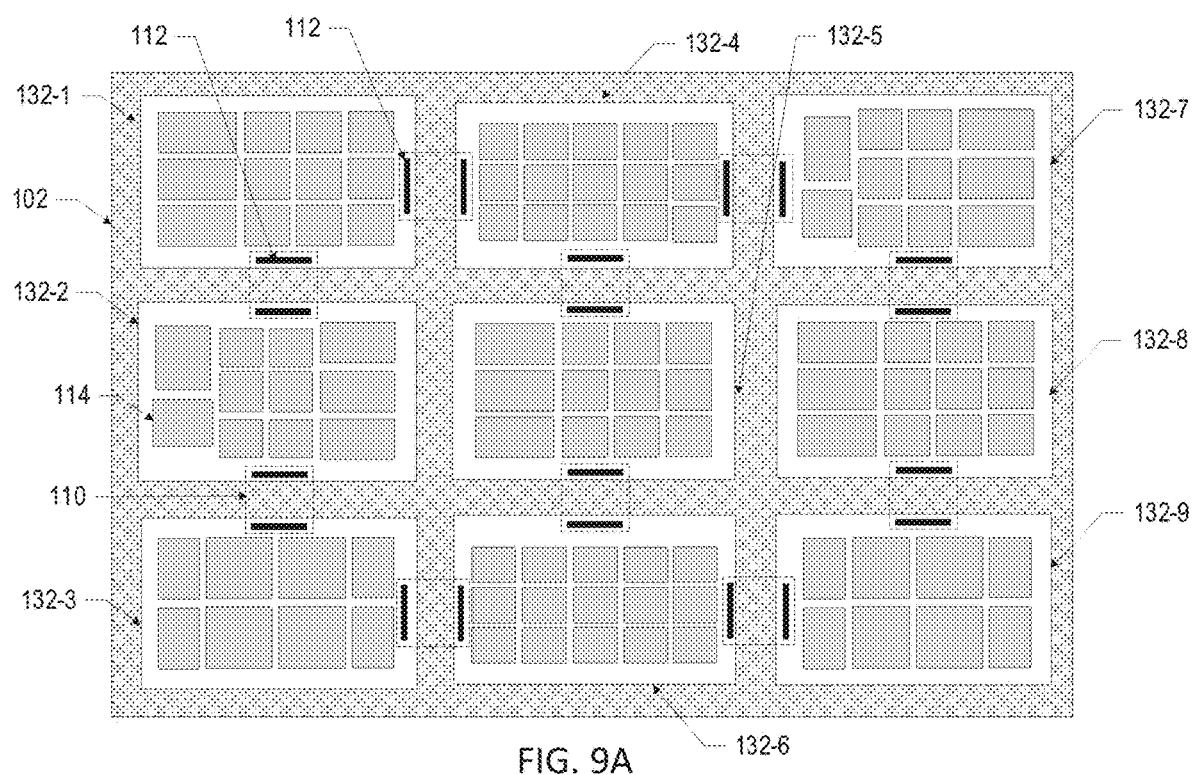
FIG. 9A is a top view of an example arrangement of multiple interposers in a microelectronic assembly, in accordance with various embodiments.

FIG. 9A is a top view of an example arrangement of multiple interposers in a microelectronic assembly, in accordance with various embodiments. FIG. 9A is an example of a package substrate 102 having multiple interposers 132 with multiple dies 114 being designed to have any number of HBW interposer-to-interposer connections. As shown in FIG. 9A, a package substrate 102 may include nine interposers 132 having HBW circuitry 112 disposed thereon. The package substrate 102 may include HBW interconnects 110 for forming interposer-to-interposer HBW connections. As shown in FIG. 9A, there are no HBW interconnects 110 between interposer 132-2 and interposer 132-5, and no HBW interconnections between interposer 132-5 and interposer 132-8.

Figure 9B:
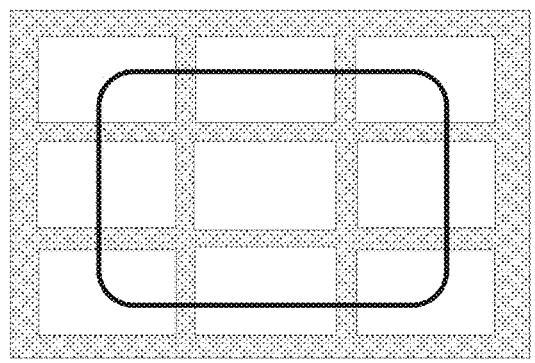
FIGS. 9B-9D are schematic illustrations of connectivity of the microelectronic assembly of FIG. 9A, in accordance with various embodiments.
Figure 9C:
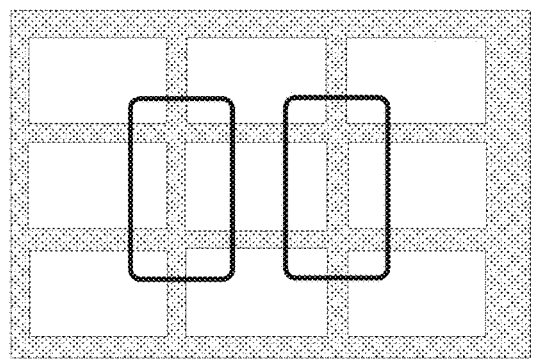
Figure 9D:
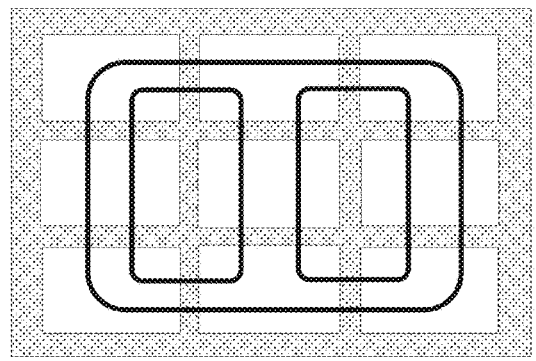

FIGS. 9B-9D are schematic illustrations of connectivity of the microelectronic assembly of FIG. 9A, in accordance with various embodiments. FIG. 9B illustrates the HBW connectivity between each of the adjacent interposers along the perimeter of the package substrate (i.e., interposers 132-1, 132-2, 132-3, 132-4, 132-6, 132-7, 132-8, and 132-9) via the HBW interconnects. For example, interposer 132-1 has a direct HBW connection to interposer 132-2 and interposer 132-4, interposer 132-3 has a direct HBW connection to interposer 132-2 and interposer 132-6, interposer 132-9 has a direct HBW connection to interposer 132-6 and interposer 132-8, and interposer 132-7 has a direct HBW connection to interposer 132-8 and interposer 132-4. FIG. 9C illustrates the HBW connectivity between each of the adjacent interposers along the first and second columns of interposers (i.e., interposers 132-1-132-6) and the second and third columns of interposers (i.e., interposers 132-4-132-9) via the HBW interconnects. FIG. 9D illustrates the combined connectivity of FIGS. 9B and 9C.

Figure 10A:
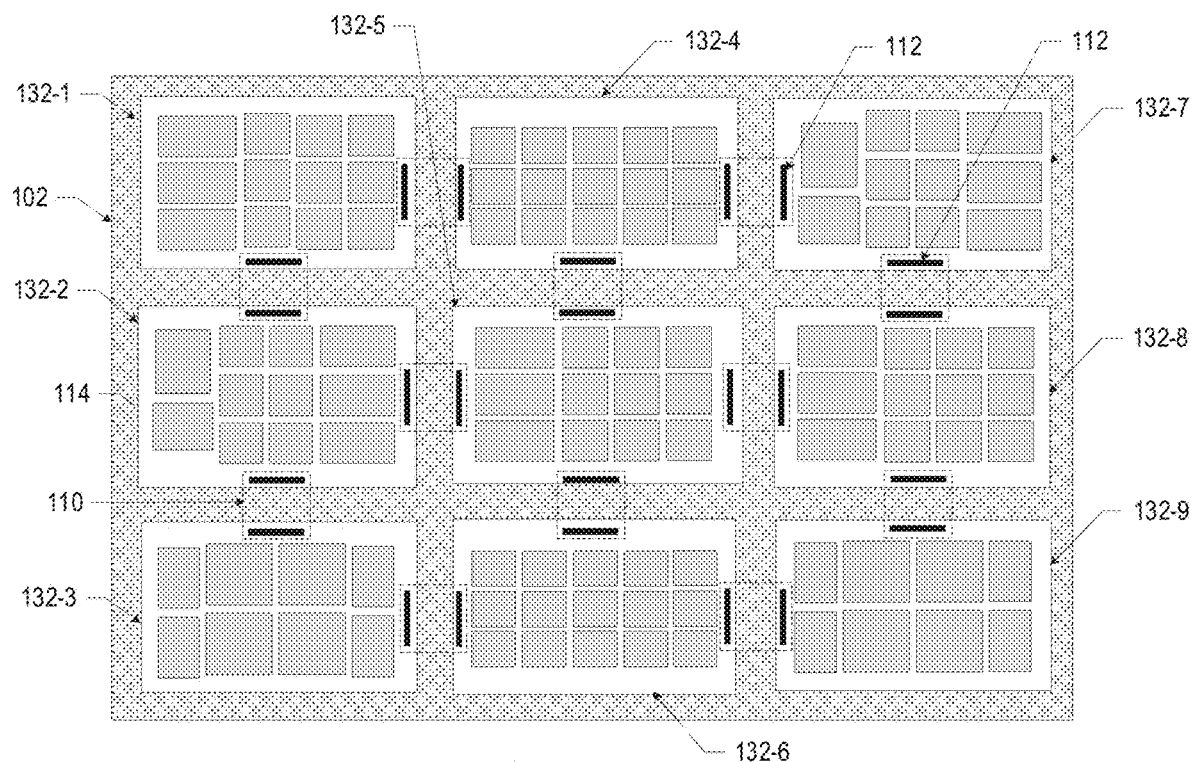
FIG. 10A is a top view of an example arrangement of multiple interposers in a microelectronic assembly, in accordance with various embodiments.

FIG. 10A is a top view of an example arrangement of multiple interposers in a microelectronic assembly, in accordance with various embodiments. FIG. 10A is another example of a package substrate 102 having multiple interposers 132 with multiple dies 114 being designed to have any number of interposer-to-interposer HBW connections. As shown in FIG. 10A, a package substrate 102 may include nine interposers 132 having HBW circuitry 112 disposed thereon. The package substrate 102 may include HBW interconnects 110 for forming interposer-to-interposer HBW connections. As shown in FIG. 10A, there are HBW interconnects 110 between each adjacent interposers 132.

Figure 10B:
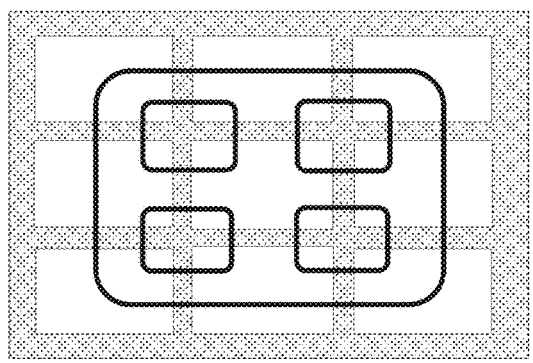
FIGS. 10B-10E are schematic illustrations of connectivity of the microelectronic assembly of FIG. 10A, in accordance with various embodiments.
Figure 10C:
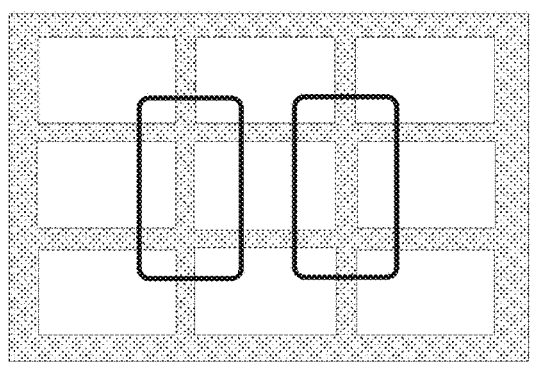
Figure 10D:
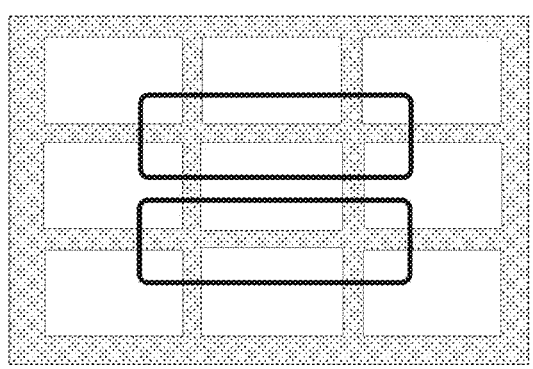
Figure 10E:
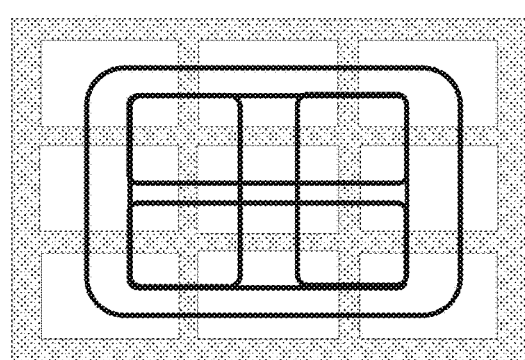

FIGS. 10B-10E are schematic illustrations of connectivity of the microelectronic assembly of FIG. 10A, in accordance with various embodiments. FIG. 10B illustrates the HBW connectivity between each of the adjacent interposers along the perimeter of the package substrate (i.e., interposers 132-1, 132-2, 132-3, 132-4, 132-6, 132-7, 132-8, and 132-9) via the HBW interconnects and between each of four adjacent interposers (e.g., interposers 132-1, 132-2, 132-4, and 132-5). FIG. 10C illustrates the HBW connectivity between each of the adjacent interposers along the first and second columns of interposers (i.e., interposers 132-1-132-6) and the second and third columns of interposers (i.e., interposers 132-4-132-9) via the HBW interconnects. FIG. 10D illustrates the HBW connectivity between each of the adjacent interposers along the first and second rows of interposers (i.e., interposers 132-1, 132-4, 132-7, 132-2, 132-5, and 132-8) and the second and third rows of interposers (i.e., interposers 132-2, 132-5, 132-8, 132-3, 132-6, and 132-9) via the HBW interconnects. FIG. 10D FIG. 10E illustrates the combined connectivity of FIGS. 10B, 10C, and 10D.

Any suitable techniques may be used to manufacture the microelectronic assemblies disclosed herein. FIGS. 11A-11D are cross-sectional side views of various stages in the manufacture of a microelectronic assembly, in accordance with various embodiments. Although the operations discussed below with reference to FIGS. 11A-11D are illustrated in a particular order, these operations may be performed in any suitable order. Additionally, although particular assemblies are illustrated in FIGS. 11A-11D, the operations discussed below with reference to FIGS. 11A-11D may be used to form any suitable assemblies. In the embodiment of FIGS. 11A-11D, the interposer 132 and the dies 114 may first be assembled into a "composite assembly," and then the composite assembly may be coupled to the package substrate 102. This approach may allow for tighter tolerances in the formation of the fine pitch interconnects, and may be particularly desirable for relatively small dies 114.

Figure 11A:
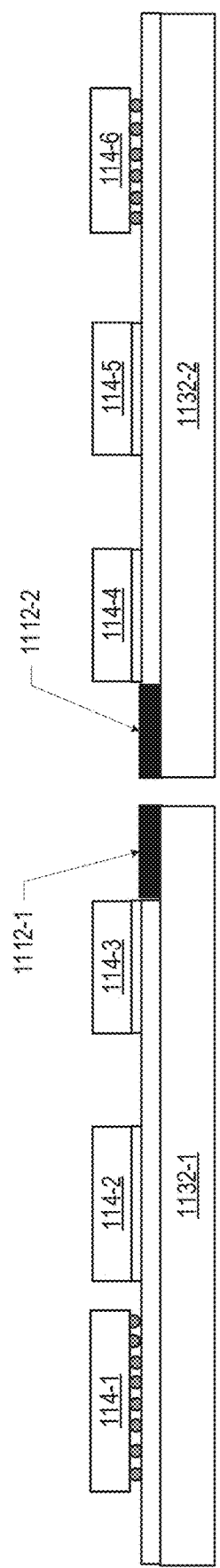
FIGS. 11A-11D are cross-sectional side views of various stages in the manufacture of a microelectronic assembly, in accordance with various embodiments.

FIG. 11A illustrates two interposers subsequent to coupling a plurality of dies 114 on the individual interposers. In particular, the dies 114-1, 114-2, 114-3 are electrically coupled to the interposer 1132-1, and the dies 114-4, 114-5, 114-6 are electrically coupled to the interposer 1132-2. The interposer 1132-1 includes HBW circuitry 1112-1 and the interposer 1132-2 includes HBW circuitry 1112-2. The dies may be coupled to the interposer using any suitable technique. In some embodiments, the dies 114 may be coupled to the interposer 1132 via solder bumps, as shown for dies 114-1, 114-6. In some embodiments, the dies may be coupled to the interposer by copper bonding, as shown for dies 114-2, 114-3, 114-4, 114-5. In some embodiments, the dies may be coupled to the interposer using other coupling techniques. In some embodiments, both the interposer and the dies have interconnect structures for coupling. In some embodiments, only the interposer or the dies have interconnect structures for coupling.

Figure 11B:
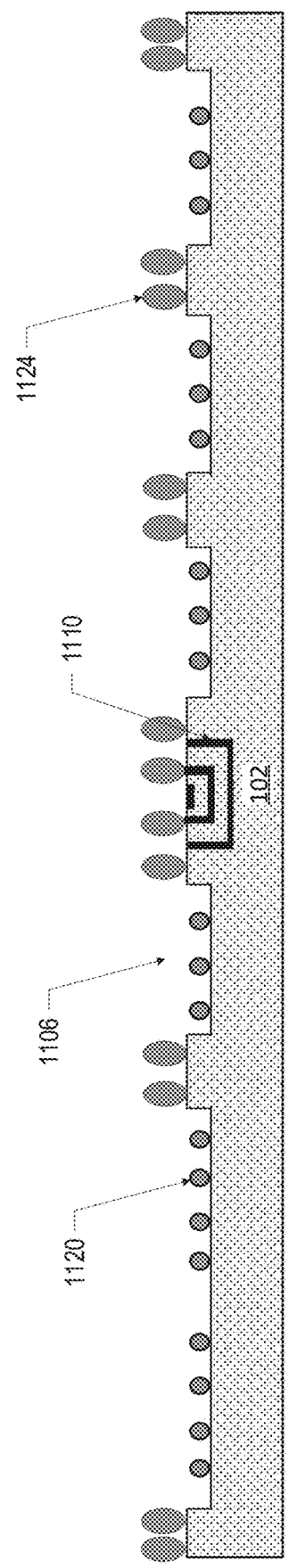

FIG. 11B illustrates a package substrate subsequent to forming a plurality of interconnect structures 1120, 1124 (e.g., solder balls), a plurality of cavities 1106, and an HBW interconnect 1110. The cavities and interconnects may be designed to align with the dies and the interconnects of the interposers of FIG. 11A. The package substrate may be formed using any suitable technique, as described above with reference to FIG. 1.

Figure 11C:
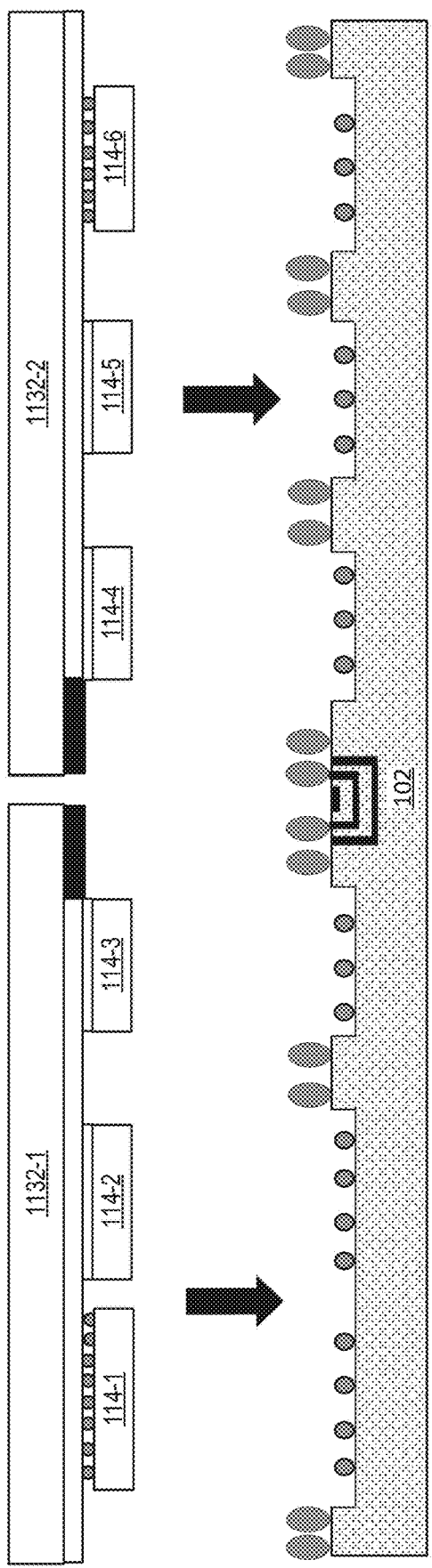

FIG. 11C illustrates the interposers of FIG. 11A subsequent to flipping and aligning with the package substrate of FIG. 11B.

Figure 11D:
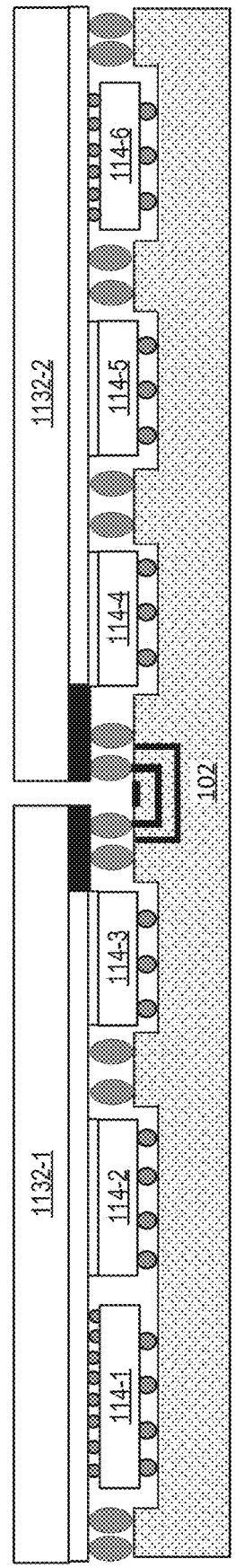

FIG. 11D illustrates an assembly subsequent to placing and coupling the interposers of FIG. 11A on the package substrate of FIG. 11B. The dies and the interposers may be coupled to the package substrate using any suitable technique, as described above with reference to FIG. 1. The HBW circuitry of the first and second interposers may be coupled to the HBW interconnect in the package substrate. Further operations may be performed as suitable (e.g., underfilling, overmolding, or attaching additional interposers or dies to the package substrate).

Figure 12:
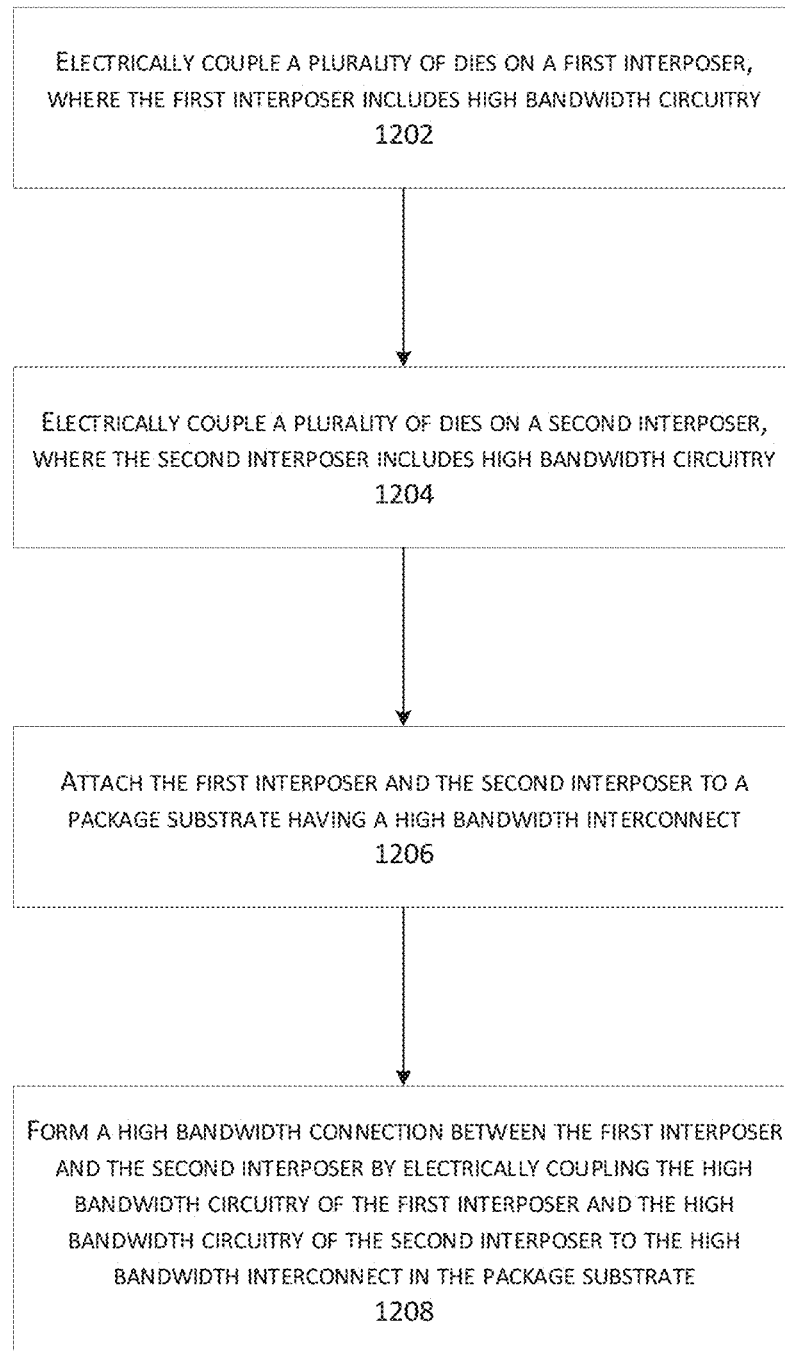
FIG. 12 is a flow diagram of an example method of manufacturing a microelectronic assembly, in accordance with various embodiments.

FIG. 12 is a flow diagram of an example method of manufacturing a microelectronic assembly, in accordance with various embodiments. At 1202, electrically couple a plurality of dies on a surface of a first interposer, where the first interposer has HBW circuitry. At 1204, electrically couple a plurality of dies on a surface of a second interposer, where the second interposer has HBW circuitry. In some embodiments, the first and second interposers may be active interposers that include the HBW circuitry on an active surface. In some embodiments, a die having HBW circuitry may be coupled to an active surface on the first and second interposers. In some embodiments, the HBW circuitry may include RF circuitry. The plurality of dies may be electrically coupled using any suitable technique, such as solder, copper-to-copper bonding, chip-to-chip bonding, or any technique as described above with reference to FIG. 1. In some embodiments, the interposers may be a single interposer. In some embodiments, the interposers may be a repeating unit that may undergo a singulation process in which each unit is separated from one another to create a single interposer. At 1206, attach the first interposer and the second interposer to a package substrate, where the package substrate includes an HBW interconnect. In some embodiments, the first interposer and the second interposer may be attached to the package substrate with the surface having the plurality of dies facing towards the package substrate. In some embodiments, the first interposer and/or the second interposer may be attached to the package substrate with the surface having the plurality of dies facing away from the package substrate. The first interposer and the second interposer may be attached to the package substrate using any suitable techniques, as described above with reference to FIG. 1. At 1208, form an HBW connection between the first interposer and the second interposer by electrically coupling the HBW circuitry of the first interposer and the HBW circuitry of the second interposer to the HBW connection in the package substrate. In some embodiments, the HBW interconnect in the package substrate is a waveguide.

Figure 13:
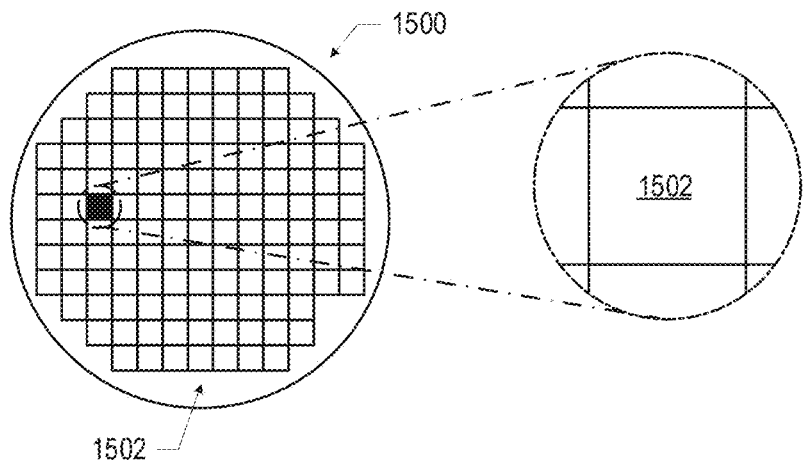
FIG. 13 are top views of a wafer and dies that may be include in a microelectronic assembly, in accordance with any of the embodiments disclosed herein.

The microelectronic assemblies 100 disclosed herein may include, or be included in, any suitable electronic device. FIGS. 13-16 illustrate various examples of apparatuses that may be included in, or that may include, one or more of any of the microelectronic assemblies 100 disclosed herein. FIG. 13 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 14, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (M RAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 14:
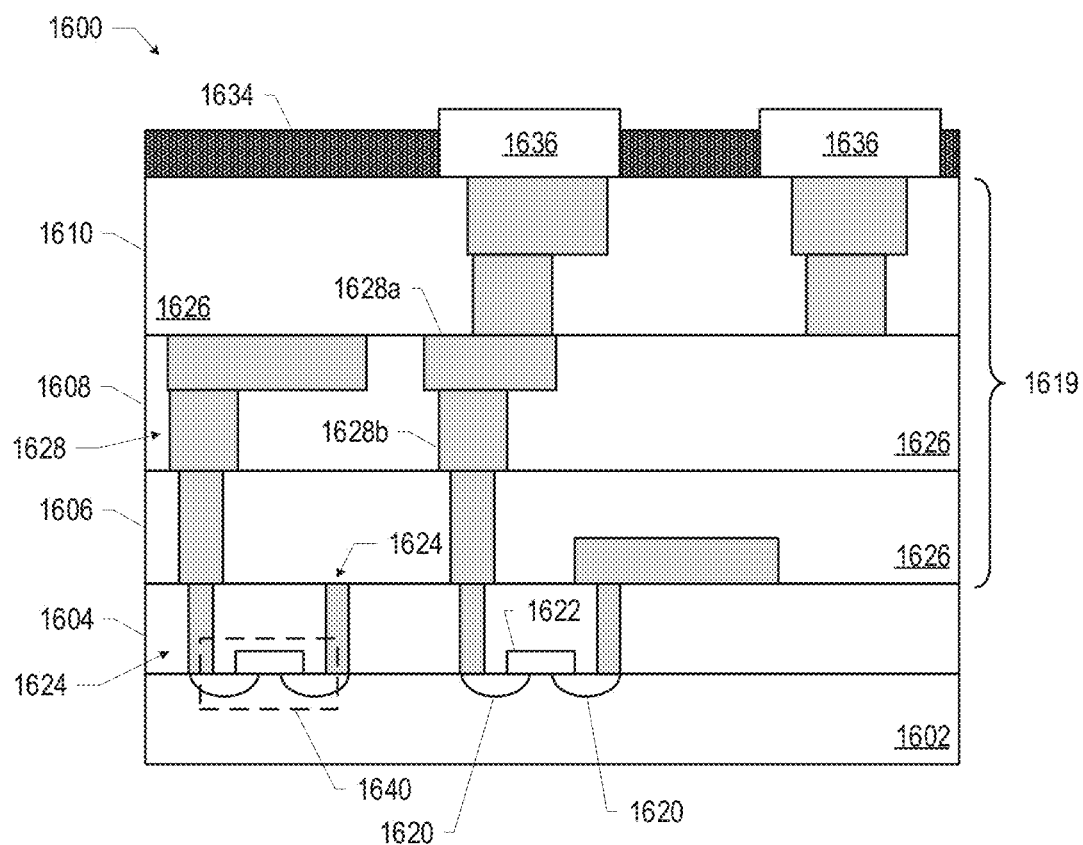
FIG. 14 is a cross-sectional side view of an IC device that may be included in a microelectronic assembly, in accordance with any of the embodiments disclosed herein.

FIG. 14 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 13). The IC device 1600 may be formed on a die substrate 1602 (e.g., the wafer 1500 of FIG. 13) and may be included in a die (e.g., the die 1502 of FIG. 13). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 13) or a wafer (e.g., the wafer 1500 of FIG. 13).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 14. Although a particular number of interconnect layers 1606-1610 is depicted in FIG. 14, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 14. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 14. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 14, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die, the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die, the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 15:
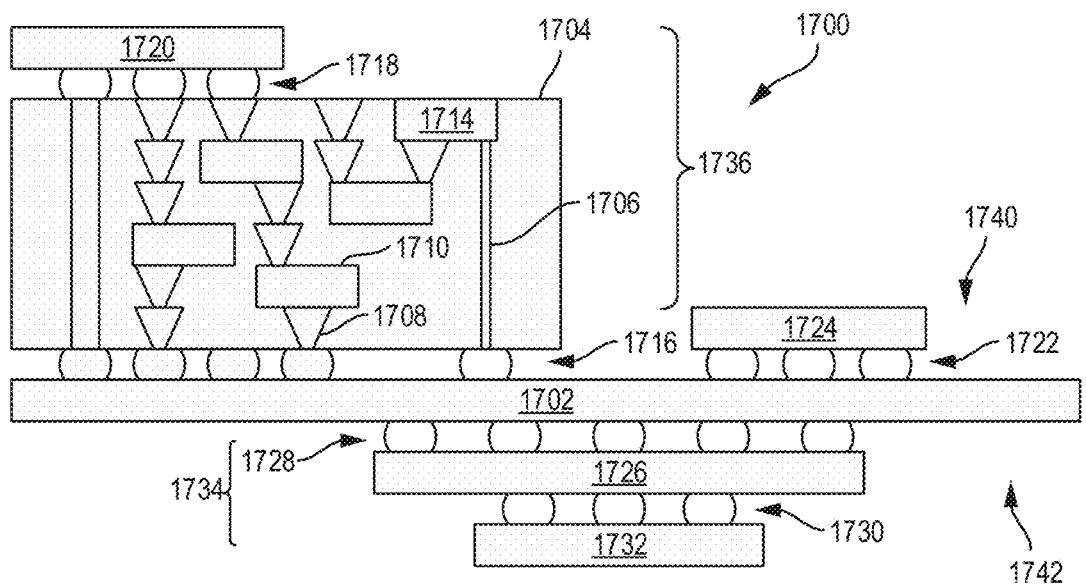
FIG. 15 is a cross-sectional side view of an IC device assembly that may be included in a microelectronic assembly, in accordance with any of the embodiments disclosed herein.

FIG. 15 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, the circuit board 133.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 13), an IC device (e.g., the IC device 1600 of FIG. 14), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
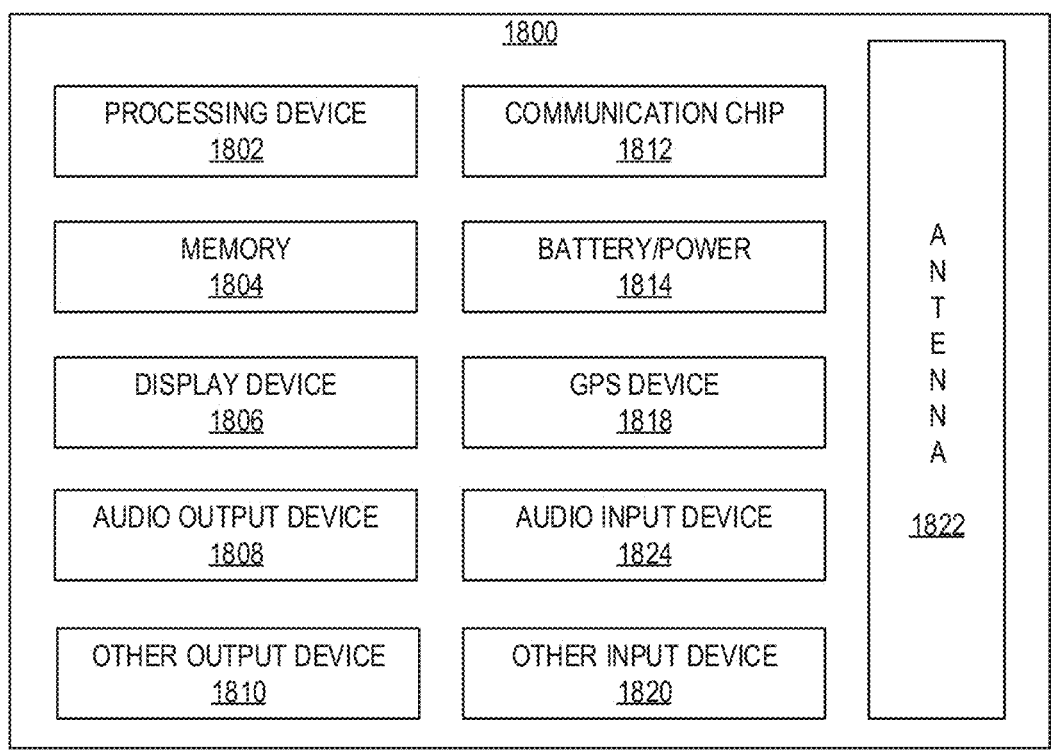
FIG. 16 is a block diagram of an example electrical device that may include in a microelectronic assembly, in accordance with any of the embodiments disclosed herein.

FIG. 16 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 16 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 16, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including: a package substrate having a high bandwidth interconnect; a first interposer having high bandwidth circuitry coupled to the package substrate, wherein the high bandwidth circuitry of/on the first interposer is electrically coupled to the high bandwidth interconnect; and a second interposer having high bandwidth circuitry coupled to the package substrate, wherein the high bandwidth circuitry of/on the second interposer is electrically coupled to the high bandwidth interconnect, and wherein the first interposer is electrically coupled to the second interposer via the high bandwidth interconnect.

Example 2 may include the subject matter of Example 1, and may further specify that the high bandwidth interconnect is a waveguide.

Example 3 may include the subject matter of Example 1, and may further specify that the high bandwidth circuitry of the first interposer is radio frequency (RF) circuitry.

Example 4 may include the subject matter of Example 1, and may further include: a first die having a first surface and an opposing second surface, wherein the first surface of the first die is electrically coupled to a surface of the package substrate and the second surface of the first die is electrically coupled to the first interposer; and a second die having a first surface and an opposing second surface, wherein the first surface of the second die is electrically coupled to the surface of the package substrate and the second surface of the second die is electrically coupled to the second interposer.

Example 5 may include the subject matter of Example 4, and may further specify that the surface of the package substrate includes a cavity, and that at least a portion of the first die is within the cavity.

Example 6 may include the subject matter of Example 4, and may further specify that the surface of the package substrate includes a first cavity and a second cavity, wherein at least a portion of the first die is within the first cavity, and wherein at least a portion of the second die is within the second cavity.

Example 7 may include the subject matter of Example 4, and may further specify that the surface of the package substrate includes a cavity, and wherein at least portions of the first die and the second die are within the cavity.

Example 8 may include the subject matter of Example 4, and may further specify that the first die is one of a central processing unit, a platform controller hub, a memory die, a field programmable gate array, and graphic processing unit.

Example 9 may include the subject matter of Example 4, and may further specify that the first die is one of a central processing unit and a platform controller hub, and the second die is one of a memory die, a field programmable gate array, and graphic processing unit.

Example 10 may include the subject matter of Example 4, and may further specify that the first die is coupled to the package substrate by first interconnects having a first pitch, and wherein the first interposer is coupled to the package substrate by second interconnects having a second pitch that is different from the first pitch.

Example 11 may include the subject matter of Example 4, and may further specify that the first die is one of a plurality of dies electrically coupled to the first interposer and the second die is one of a plurality of dies coupled to the second interposer.

Example 12 may include the subject matter of Example 4, and may further specify that the first interposer has a first surface and an opposing second surface, wherein the first interposer includes a through-silicon via, and wherein the first die is electrically coupled to/on the first surface of the first interposer, and the microelectronic assembly further includes: a third die electrically coupled to/on the second surface of the first interposer.

Example 13 may include the subject matter of Example 1, and may further specify that the first interposer includes a through-silicon via.

Example 14 may include the subject matter of Example 1, and may further specify that the first interposer is an active interposer.

Example 15 may include the subject matter of Example 1, and may further include: a circuit board coupled to the package substrate.

Example 16 is a microelectronic assembly, including: a package substrate including an RF waveguide; a first interposer having a first surface including RF circuitry and an opposing second surface, wherein the RF circuitry of the first interposer is electrically coupled to the RF waveguide; and a second interposer having a first surface including RF circuitry and an opposing second surface, wherein the RF circuitry of the second interposer is electrically coupled to the RF waveguide, and wherein the first interposer is electrically coupled to the second interposer via the RF waveguide.

Example 17 may include the subject matter of Example 16, and may further include: a first die having a first surface and an opposing second surface, wherein the first surface of the first die is electrically coupled to a surface of the package substrate and the second surface of the first die is electrically coupled to the first surface of the first interposer; and a second die having a first surface and an opposing second surface, wherein the first surface of the second die is electrically coupled to the surface of the package substrate and the second surface of the second die is electrically coupled to the first surface of the second interposer.

Example 18 may include the subject matter of Example 17, and may further specify that the first die is one of a plurality of dies electrically coupled to the first interposer and the second die is one of a plurality of dies coupled to the second interposer.

Example 19 may include the subject matter of Example 17, and may further specify that the first die is one of a central processing unit, a platform controller hub, a memory die, a field programmable gate array, and graphic processing unit.

Example 20 may include the subject matter of Example 17, and may further specify that the first die is one of a central processing unit and a platform controller hub, and the second die is one of a memory die, a field programmable gate array, and graphic processing unit.

Example 21 may include the subject matter of Example 16, and may further specify that the first surface of the first interposer is opposite the package substrate, wherein the first interposer includes a through-silicon via, and wherein the RF circuitry of the first interposer is electrically coupled to the RF waveguide by the through-silicon via.

Example 22 is a computing device, including: a microelectronic assembly, comprising: a package substrate including an RF waveguide; a first interposer coupled to the package substrate; an RF die having a first surface and an opposing second surface, wherein the first surface of the RF die is electrically coupled to the RF waveguide and the second surface of the RF die is electrically coupled to the first interposer; and a second interposer having a first surface including RF circuitry and an opposing second surface, wherein RF circuitry of the second interposer is electrically coupled to the RF waveguide, and wherein the first interposer is electrically coupled to the second interposer via the RF waveguide.

Example 23 may include the subject matter of Example 22, and may further specify that the package substrate includes a cavity, and at least a portion of the RF die is within the cavity.

Example 24 may include the subject matter of Example 22, and may further specify that the RF die is one of a plurality of dies electrically coupled to the first interposer.

Example 25 may include the subject matter of Example 24, and may further specify that an individual one of the plurality of dies is not the RF die and is gone of a central processing unit, a platform controller hub, a memory die, a field programmable gate array, and graphic processing unit.

Example 26 may include the subject matter of Example 22, and may further specify that the RF die is a first RF die and the RF waveguide is a first RF waveguide, wherein the package substrate further includes a second RF waveguide, and the microelectronic assembly further includes: a second RF die having a first surface and an opposing second surface, wherein the first surface of the second RF die is electrically coupled to the second RF waveguide and the second surface of the second RF die is electrically coupled to the first interposer; and a third interposer having a first surface including RF circuitry and an opposing second surface, wherein RF circuitry of the third interposer is electrically coupled to the second RF waveguide, and wherein the third interposer is electrically coupled to the first interposer via the second RF waveguide.

Example 27 is a method of manufacturing a microelectronic assembly, including: electrically coupling a plurality of dies on a first interposer, wherein the first interposer includes high bandwidth circuitry; electrically coupling a plurality of dies on a second interposer, wherein the second interposer includes high bandwidth circuitry; coupling the first interposer and the second interposer to a package substrate having a high bandwidth interconnect; electrically coupling the high bandwidth circuitry in the first interposer and the high bandwidth interconnect in the package substrate; and electrically coupling the high bandwidth circuitry in the second interposer and the high bandwidth interconnect in the package substrate.

Example 28 may include the subject matter of Example 27, and may further specify that the high bandwidth interconnect in the package substrate is an RF waveguide.

Example 29 may include the subject matter of Example 27, and may further specify that the high bandwidth circuitry in the first interposer is RF circuitry.

Example 30 may include the subject matter of Example 27, and may further include: electrically coupling the plurality of dies on/to the first interposer to the package substrate.

Example 31 may include the subject matter of Example 27, and may further include: electrically coupling the plurality of dies on the second interposer to the package substrate.

Example 32 may include the subject matter of Example 27, and may further include: electrically coupling the package substrate to a circuit board.

Example 33 is a microelectronic assembly, including: a package substrate including an RF waveguide; a first interposer having a first surface including RF circuitry and an opposing second surface, wherein RF circuitry of the first interposer is electrically coupled to the RF waveguide; a second interposer having a first surface including RF circuitry and an opposing second surface, wherein RF circuitry of the second interposer is electrically coupled to the RF waveguide, and wherein the first interposer is electrically coupled to the second interposer via the RF waveguide; a plurality of first dies between the first surface of the first interposer and a surface of the package substrate, wherein the plurality of first dies are electrically coupled to the first interposer and the package substrate; and a plurality of second dies between the first surface of the second interposer and the surface of the package substrate, wherein the plurality of second dies are electrically coupled to the second interposer and the package substrate.

Example 34 may include the subject matter of Example 33, and may further specify that the package substrate includes a cavity, and at least a portion of an individual one of the plurality of first dies is within the cavity.

Example 35 may include the subject matter of Example 33, and may further specify that an individual one of the plurality of first dies is one of a central processing unit, a platform controller hub, a memory die, a field programmable gate array, and graphic processing unit.

Example 36 may include the subject matter of Example 33, and may further include: a circuit board coupled to the package substrate.

Example 37 may include the subject matter of Example 33, and may further specify that the microelectronic assembly is included in a server device.

Example 38 may include the subject matter of Example 33, and may further specify that the microelectronic assembly is included in a portable computing device.

Example 39 may include the subject matter of Example 33, and may further specify that the microelectronic assembly is included in a wearable computing device.

Example 40 is a microelectronic assembly, including: a package substrate including a high bandwidth interconnect; a first interposer having a first surface including high bandwidth circuitry and an opposing second surface, wherein the first surface has a first die and a second die coupled thereon, wherein the first die is electrically coupled to the second die via conductive pathways in the first interposer, and wherein the first surface of the first interposer is coupled to a surface of the package substrate; and a second interposer having a first surface including high bandwidth circuitry and an opposing second surface, wherein the second surface has a third die and a fourth die coupled thereon, wherein the third die is electrically coupled to the fourth die via conductive pathways in the second interposer, wherein the first surface of the second interposer is coupled to the surface of the package substrate, and wherein the first interposer is coupled to the second interposer via the high bandwidth interconnect.

Example 41 may include the subject matter of Example 40, and may further specify that the high bandwidth interconnect is a waveguide.

Example 42 may include the subject matter of Example 40, and may further specify that the high bandwidth circuitry of the first interposer is radio frequency (RF) circuitry.

Example 43 may include the subject matter of Example 40, and may further specify that the high bandwidth circuitry of the second interposer is RF circuitry.

Example 44 may include the subject matter of Example 40, and may further specify that the third die is one of a central processing unit, a platform controller hub, a memory die, a field programmable gate array, and graphic processing unit.

Example 45 may include the subject matter of Example 40, and may further specify that the third die is one of a central processing unit and a platform controller hub, and the fourth die is one of a memory die, a field programmable gate array, and graphic processing unit.

The invention claimed is:

1. A microelectronic assembly, comprising:
   a package substrate having a high bandwidth interconnect;
   a first interposer having high bandwidth circuitry coupled to the package substrate, wherein the high bandwidth circuitry of the first interposer is electrically coupled to the high bandwidth interconnect;
   a first die having a first surface and an opposing second surface, wherein the first surface of the first die is electrically coupled to a surface of the package substrate and the second surface of the first die is electrically coupled to the first interposer;
   a second interposer having high bandwidth circuitry coupled to the package substrate, wherein the high bandwidth circuitry of the second interposer is electrically coupled to the high bandwidth interconnect, and wherein the first interposer is electrically coupled to the second interposer via the high bandwidth interconnect; and
   a second die having a first surface and an opposing second surface, wherein the first surface of the second die is electrically coupled to the surface of the package substrate and the second surface of the second die is electrically coupled to the second interposer.

2. The microelectronic assembly of claim 1, wherein the high bandwidth interconnect is a waveguide.

3. The microelectronic assembly of claim 1, wherein the high bandwidth circuitry of the first interposer is radio frequency (RF) circuitry.

4. The microelectronic assembly of claim 1, wherein the first die is one of a plurality of first dies and the second die is one of a plurality of second dies.

5. The microelectronic assembly of claim 1, wherein the surface of the package substrate includes a cavity, and wherein at least a portion of the first die is within the cavity.

6. The microelectronic assembly of claim 1, wherein the surface of the package substrate includes a first cavity and a second cavity, wherein at least a portion of the first die is within the first cavity, and wherein at least a portion of the second die is within the second cavity.

7. The microelectronic assembly of claim 1, wherein the surface of the package substrate includes a cavity, and wherein at least portions of the first die and the second die are within the cavity.

8. The microelectronic assembly of claim 1, wherein the first die is one of a central processing unit, a platform controller hub, a memory die, a field programmable gate array, and graphic processing unit.

9. The microelectronic assembly of claim 1, wherein the first die is coupled to the package substrate by first interconnects having a first pitch, and wherein the first interposer is coupled to the package substrate by second interconnects having a second pitch that is different from the first pitch.

10. The microelectronic assembly of claim 1, wherein the first interposer has a first surface and an opposing second surface, wherein the first interposer includes a through-silicon via, and wherein the first die is electrically coupled to the first surface of the first interposer, and the microelectronic assembly further comprises:
    a third die electrically coupled to the second surface of the first interposer.

11. The microelectronic assembly of claim 1, further comprising:
    a circuit board coupled to the package substrate.

12. A microelectronic assembly, comprising:
    a package substrate including a radio frequency (RF) waveguide;
    a first interposer having a first surface including RF circuitry and an opposing second surface, wherein the RF circuitry of the first interposer is electrically coupled to the RF waveguide;
    a first die having a first surface and an opposing second surface, wherein the first surface of the first die is electrically coupled to a surface of the package substrate and the second surface of the first die is electrically coupled to the first surface of the first interposer;
    a second interposer having a first surface including RF circuitry and an opposing second surface, wherein the RF circuitry of the second interposer is electrically coupled to the RF waveguide, and wherein the first interposer is electrically coupled to the second interposer via the RF waveguide; and
    a second die having a first surface and an opposing second surface, wherein the first surface of the second die is electrically coupled to the surface of the package substrate and the second surface of the second die is electrically coupled to the first surface of the second interposer.

13. The microelectronic assembly of claim 12, wherein the first die is one of a plurality of first dies and the second die is one of a plurality of second dies.

14. The microelectronic assembly of claim 12, wherein the first die is one of a central processing unit and a platform controller hub, and the second die is one of a memory die, a field programmable gate array, and graphic processing unit.

15. The microelectronic assembly of claim 12, wherein the first surface of the first interposer is opposite the package substrate, wherein the first interposer includes a through-silicon via, and wherein the RF circuitry of the first interposer is electrically coupled to the RF waveguide by the through-silicon via.

16. A computing device, comprising:
a microelectronic assembly, comprising:
 a package substrate including a radio frequency (RF) waveguide;
 a first interposer coupled to the package substrate;
 an RF die having a first surface and an opposing second surface, wherein the first surface of the RF die is electrically coupled to the RF waveguide and the second surface of the RF die is electrically coupled to the first interposer; and
 a second interposer having a first surface including RF circuitry and an opposing second surface, wherein RF circuitry of the second interposer is electrically coupled to the RF waveguide, and wherein the first interposer is electrically coupled to the second interposer via the RF waveguide.

17. The computing device of claim 16, wherein the package substrate includes a cavity, and at least a portion of the RF die is within the cavity.

18. The computing device of claim 16, wherein the RF die is one of a plurality of dies electrically coupled to the first interposer.

19. The computing device of claim 18, wherein an individual one of the plurality of dies is not the RF die and is one of a central processing unit, a platform controller hub, a memory die, a field programmable gate array, and graphic processing unit.

20. The computing device of claim 16, wherein the RF die is a first RF die and the RF waveguide is a first RF waveguide, wherein the package substrate further includes a second RF waveguide, and the microelectronic assembly further comprises:
 a second RF die having a first surface and an opposing second surface, wherein the first surface of the second RF die is electrically coupled to the second RF waveguide and the second surface of the second RF die is electrically coupled to the first interposer; and
 a third interposer having a first surface including RF circuitry and an opposing second surface, wherein RF circuitry of the third interposer is electrically coupled to the second RF waveguide, and wherein the third interposer is electrically coupled to the first interposer via the second RF waveguide.

21. A method of manufacturing a microelectronic assembly, comprising:
 electrically coupling a plurality of dies on a first interposer, wherein the first interposer includes high bandwidth circuitry;
 electrically coupling a plurality of dies on a second interposer, wherein the second interposer includes high bandwidth circuitry;
 coupling the first interposer and the second interposer to a package substrate having a high bandwidth interconnect;
 electrically coupling the high bandwidth circuitry in the first interposer and the high bandwidth interconnect in the package substrate; and
 electrically coupling the high bandwidth circuitry in the second interposer and the high bandwidth interconnect in the package substrate.

22. The method of claim 21, wherein the high bandwidth interconnect in the package substrate is a radio frequency (RF) waveguide.

23. The method of claim 21, wherein the high bandwidth circuitry in the first interposer is RF circuitry.

24. The method of claim 21, further comprising:
 electrically coupling the plurality of dies on the first interposer to the package substrate.

25. The method of claim 21, further comprising:
 electrically coupling the plurality of dies on the second interposer to the package substrate.

\* \* \* \* \*